United States Patent [19]

Takahashi et al.

[11] Patent Number: 5,618,749
[45] Date of Patent: Apr. 8, 1997

[54] METHOD OF FORMING A SEMICONDUCTOR DEVICE HAVING A CAPACITOR AND A RESISTOR

[75] Inventors: Toshiyuki Takahashi; Shigeru Suga; Touhachi Makino, all of Hamamatsu, Japan

[73] Assignee: Yamaha Corporation, Japan

[21] Appl. No.: 414,761

[22] Filed: Mar. 31, 1995

[51] Int. Cl.$^6$ .............................. H01L 21/70; H01L 27/00
[52] U.S. Cl. .................................. 438/384; 148/DIG. 14; 148/DIG. 136; 438/238
[58] Field of Search .............................. 437/60, 919, 918, 437/52; 148/DIG. 14, DIG. 136

[56] References Cited

U.S. PATENT DOCUMENTS

| | | | |
|---|---|---|---|
| 3,988,824 | 11/1976 | Bodway | 29/577 |
| 4,367,580 | 1/1983 | Guterman | 29/571 |
| 4,971,924 | 11/1990 | Tigelaar et al. | 437/60 |
| 5,013,678 | 5/1991 | Winneri et al. | 437/52 |
| 5,120,572 | 6/1992 | Kumar | 437/60 |
| 5,173,437 | 12/1992 | Chi | 437/60 |
| 5,187,122 | 2/1993 | Bonis | 437/200 |
| 5,393,691 | 2/1995 | Hsu et al. | 437/60 |
| 5,397,729 | 3/1995 | Kayanuma et al. | 437/52 |
| 5,470,775 | 11/1995 | Nariani | 437/52 |
| 5,500,387 | 3/1996 | Tung et al. | 437/60 |

FOREIGN PATENT DOCUMENTS 5-090502 4/1993 Japan.
5-211284 8/1993 Japan.

OTHER PUBLICATIONS

McCreary, James I., IEEE Journal Of Solid–State Circuits, "Matching Properties, and Voltage and Temperature Dependence of MOS Capacitors", vol. SC–16, Dec. 1981, pp. 608–615.

S.R. Nariani, et al., "Adding mixed–signal capability to a submicron digital ASIC process", Solid State Technology, Aug. 1994, pp. 79–83.

Primary Examiner—Jey Tsai

[57] ABSTRACT

A semiconductor integrated circuit including a MOSFET having a polycide gate structure, a resistor and a capacitor is monolithically manufactured. Polycrystalline silicon film, a dielectric film, and another polycrystalline silicon film are consecutively deposited. After processes of patterning and etching the dielectric film, the remaining dielectric films are used as an etching protection mask for the resistor and a capacitor. A refractory metal silicide for a polycide gate is uniformly deposited over the remaining another polycrystalline silicon films and dielectric films. The refractory metal silicide and polycrystalline silicon are consecutively etched through a patterned resist mask and the remaining dielectric films to simultaneously form the polycide gate, resistor and capacitor. Thus, a capacitor having small change in capacitance versus applied voltage is manufactured in a MOS IC device having a polycide gate.

13 Claims, 10 Drawing Sheets

METHOD OF FORMING A SEMICONDUCTOR DEVICE HAVING A CAPACITOR AND A RESISTOR

BACKGROUND OF THE INVENTION a) Field of the Invention

The present invention relates to a semiconductor device and a method of manufacturing the same, and more particularly to such a device and a method suitable for analog MOS integrated circuits.

b) Description of the Related Art

Analog integrated circuits are known in which active elements such as metal-oxide-semiconductor field effect transistors (MOSFETs) and passive elements such as capacitors and resistors are formed on a semiconductor substrate, and interconnected by metal wiring patterns. Conventionally, in forming capacitors and resistors on the semiconductor substrate of an analog integrated circuit of this type, the following methods have been used.

Capacitor Forming Methods

Method 1

The lower electrode of a capacitor is Formed by using the same material as the gate electrode (hereinafter called gate material) such as polycrystalline silicon or polycide (a laminated layer of polycrystalline silicon and silicidized metal). Next, the lower electrode is covered with a dielectric film serving as a capacitor insulating or dielectric layer. An upper electrode is then formed on the capacitor insulating layer, opposing the lower electrode.

Method 2

A semiconductor substrate is used as the lower electrode of a capacitor. Namely, after a gate oxide film and field oxide film are grown on the substrate surface, the gate material layer is deposited on the oxide film and selectively etched to form the gate electrode and the upper electrode of the capacitor at the same time.

Method 3

An interlayer insulating film for multilayer wiring is used as a dielectric film of a capacitor. Namely, after the lower electrode of the capacitor is formed by utilizing a part of the same layer as the gate electrode, an interlayer insulating film is formed on the whole surface of the substrate. The upper electrode of metal or gate material is formed on the interlayer insulating film, opposing the lower electrode. In the ease of an integrated circuit using a two-layer wiring process, the lower electrode of a capacitor is formed by using the lower metal wiring layer, and the upper electrode is formed on the interlayer insulating film by using the upper metal wiring layer, opposing the lower electrode.

Resistor Forming Methods

Method 4

The diffusion region serving as a resistor is formed at the same time when source and drain diffusion regions of a MOSFET are formed on the surface of a semiconductor substrate.

Method 5

For a CMOS integrated circuit, a well region is used as a resistor.

Method 6

A gate electrode layer is patterned to form a resistor.

The above methods are associated with the following aspects which are desired to be solved.

Method 1

After the gate electrode is formed, a dielectric film having an appropriate thickness is formed and then the upper electrode is formed thereon. Therefore, the number of additional steps required for forming the capacitor increases, resulting in a high manufacturing cost. Further, a thermal oxide film is usually used as the capacitor insulating film in these additional steps for performing a capacitor element. This thermal oxide film is usually formed in a high temperature atmosphere of about 1000° to 1100° C. In this thermal treatment, impurities doped for forming source/drain of the MOSFET are caused to diffuse to thereby vary the electric characteristics from the desired ones, such as the change of the threshold voltage.

Method 2

Because the semiconductor substrate is used as the lower electrode, the potential of the electrode is Fixed to the substrate potential. Therefore, this method is applicable only to the capacitor, one of the electrodes of which is connected to a power source or ground line. As a result, freedom of layout of circuit elements is restricted. Namely, the freedom of design such as the layout of elements and wiring becomes low. If the gate oxide film or field oxide film is thick and the required capacitance is large, the area occupied by the capacitor becomes very large.

Method 3

If the thickness of the interlayer insulating film is not proper, the area occupied by the capacitor becomes very large like Method 2. The interlayer insulating film is generally subjected to a flattening process, so that the film thickness is not always uniform. Furthermore, parasitic capacitance may appear unless wirings are properly set, so that pattern design is difficult.

Methods 4 and 5

Both the methods use a diffusion region as a resistor. As a result, a large parasitic capacitance between the diffusion region and the semiconductor substrate is added to the resistor, adversely affecting the operation off the circuit having such a resistor.

Method 6

To prevent an increase in gate resistance due to a short gate length, polycide is used as the gate material. However, the resistance value of polycide is difficult to be controlled precisely.

SUMMARY OF THE INVENTION

It is an object of the present invention to provide a semiconductor device having MOSFETs, capacitors, and resistors, capable of being manufactured without complicating the manufacturing processes too much, without increasing the manufacturing cost, and without sacrificing the electric properties of the circuit elements.

According to one aspect of the present invention, there is provided a semiconductor device comprising: a thin insulating film and a thick insulating film formed on a surface of a semiconductor substrate; a gate electrode formed on said thin insulating film, said gate electrode having a laminated structure of a conductive layer of a first material and a metal layer; a capacitor element having a laminated structure of the conductive layer of the first material a dielectric film, another conductive layer of the first material, and said metal layer; and a resistor element having a laminated structure of said conductive layer of the first material and said dielectric film.

According to another aspect of the present invention, there is provided a semiconductor device comprising: a semiconductor substrate having an active region and a field insulating film; a field effect transistor formed in the active region, the field effect transistor having a gate electrode comprising a first conductive film of a first material and a refractory metal silicide layer; a resistor element comprising a second conductive film of the first material having a first thickness and a dielectric film having a second thickness thereon; a capacitor element comprising: a lower electrode layer comprising a third conductive film of the first material having a thickness identical to the first thickness of the resistor element; a dielectric layer having thick and thin portions, wherein the thin portion having a thickness identical to the second thickness of the dielectric film formed on the resistor element; and an upper electrode layer comprising a fourth conductive film of the first material and a refractor metal silicide layer.

According to a further aspect of the present invention, there is provided a method of manufacturing a semiconductor device having at least a MOSFET and a capacitor element formed over the surface of a semiconductor substrate, comprising the steps of: (a) forming a gate oxide film on the surface of said semiconductor substrate; (b) forming a first conductive layer of a first material on said gate oxide film; (c) forming a dielectric film for a capacitor insulating film on said first conductive layer; (d) forming a second conductive layer of the first material on said dielectric film; (e) removing said dielectric film and said second conductive layer while leaving unremoved an area corresponding to a lower electrode of said capacitor element; (f) forming a refractory material layer covering said polycrystalline silicon layer, said dielectric film and said another polycrystalline silicon layer; (g) forming a masking member covering said refractory material layer at the area corresponding to an upper electrode of said capacitor element and an area corresponding to a gate electrode of said MOSFET; and (h) removing said refractory material layer and said second conductive layer at an area other than said areas corresponding to the upper electrode and the gate electrode and removing said first conductive layer not covered with said dielectric film, by using said mask member as an etching mask and said dielectric film as an etching stopper, wherein said capacitor element has a structure such that said dielectric film is sandwiched between said first conductive layer and said second conductive layer.

According to a still further aspect of the present invention, there is provided a method of manufacturing a semiconductor device having at least a MOSFET, a capacitor element, and a resistor formed on the surface of a semiconductor substrate, comprising the steps of: (a) forming a gate oxide film on the surface of said semiconductor substrate; (b) forming a first conductive layer of a first material on said gate oxide film; (c) forming a dielectric film used for capacitor insulating film on said first conductive layer; (d) forming a second conductive layer of the first material on said dielectric film; (e) removing said dielectric film and said second conductive layer while leaving unremoved areas corresponding to a lower electrode of said capacitor element and said resistor element respectively; (f) forming a refractory material layer covering said first conductive layer, said dielectric film and said second conductive layer; (g) forming a masking member covering said refractory material layer at an area corresponding to an upper electrode of said capacitor element and an area corresponding to a gate electrode of said MOSFET; and (h) removing said refractory material layer and said second conductive layer at an area other than said areas corresponding to the upper electrode and the gate electrode and removing said first conductive layer not covered with said dielectric film, by using said mask member as an etching mask and said dielectric film as an etching stopper, wherein said capacitor element has a structure such that said dielectric film is sandwiched between said first conductive layer and said second conductive layer, and said resistor element is made of said first conductive layer.

According to a still further aspect of the present invention, there is provided a method of manufacturing a semiconductor device having at least a transistor, a resistor and a capacitor over a semiconductor substrate, comprising the steps of: (a) providing the semiconductor substrate; (b) forming a first oxide insulating film on a surface of the semiconductor substrate; (c) forming field oxide insulating films on a surface of the semiconductor substrate to leave the first oxide insulating films at regions where at least the transistor is to be formed; (d) forming a first conductive film of a first material over the field oxide insulating films and the first oxide insulating films; (e) forming a dielectric film over the first conductive film; (f) forming a second conductive film of the first material over the dielectric film; (g) patterning said second conductive film and the dielectric film to leave said second conductive film and the dielectric film in regions where the resistor and the capacitor are to be formed; (h) forming a refractory metal silicide film over remaining said second conductive films, and dielectric films, and the first conductive film; (i) patterning the refractory metal silicide film to leave the refractory metal silicide films only in regions where the capacitor and gate of the transistor are to be formed; (j) forming the capacitor and the gate of the transistor by removing the refractor metal silicide film, said second conductive films and the first conductive film; (k) simultaneously forming a resistor at a position where the dielectric film remains; (l) heating the semiconductor device to enhance silicidation of said refractory metal silicide films; and (m) forming a source and drain region of the transistor.

According to a still further aspect of the present invention, there is provided a semiconductor device comprising: a substrate; an active device formed on the substrate, said active device having laminated conductive layers thereon, the laminated conductive layers comprising a first layer of a first material and a second layer of a second material; and a capacitor formed over the substrate, said capacitor comprising a lower electrode of the first material, a dielectric layer formed on the lower electrode, and an upper electrode formed on the dielectric layer, said upper electrode having a first sublayer of the first material and a second sublayer of the second material.

It is possible to form a gate electrode having a polycide structure which is formed of a polycrystalline silicon layer and a refractory material layer, a capacitor element having a capacitor insulating film sandwiched between the polycrystalline silicon layer and the laminated layers having a refractory material layer and another polycrystalline silicon layer, and a resistor element made of a single layer of the polycrystalline silicon layer.

It is therefore possible to easily manufacture a semiconductor device having MOSFETs, capacitors, and resistors, without complicating the manufacturing processes too much, without increasing the manufacturing cost, and without sacrificing the electric properties of the circuit elements.

The capacitor insulating film of a capacitor element is sandwiched between two polycrystalline silicon layers. When a voltage is applied between capacitor electrodes, depletion region occurs near the surface of one polycrystalline silicon layer and accumulation region occurs near the surface of the other polycrystalline silicon layer. The change in capacitance versus applied voltage reduces, compared to the case of metal-insulator-semiconductor capacitor.

DETAILED DESCRIPTION OF THE PREFERRED EMBODIMENTS

Embodiments of the invention will be described with reference to the accompanying drawings.

Figure 1:
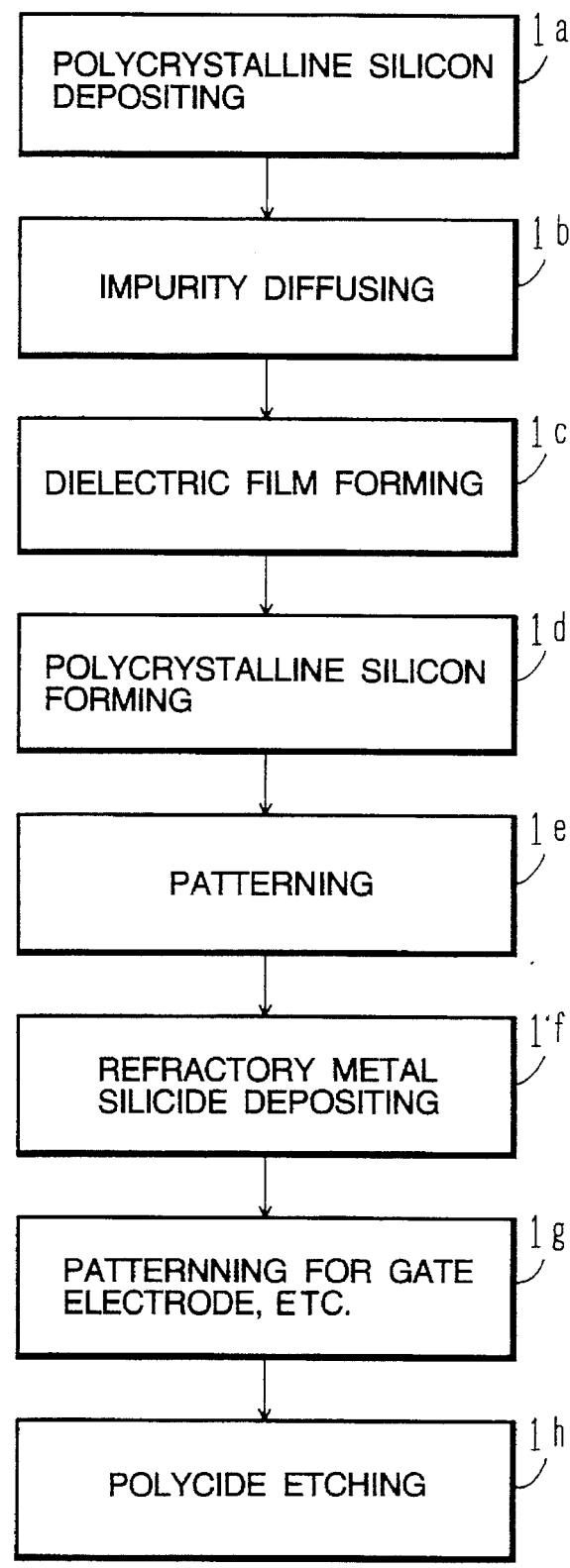
FIG. 1 is a flow chart explaining the steps of manufacturing a semiconductor device according to an embodiment of the present invention.

FIG. 1 is a flow chart explaining the steps of manufacturing an analog MOS integrated circuit according to an embodiment of the invention. This flow chart shows only the steps characteristic to the embodiment, and other manufacturing steps commonly used for ordinary MOS integrated circuits are omitted.

Figure 2:
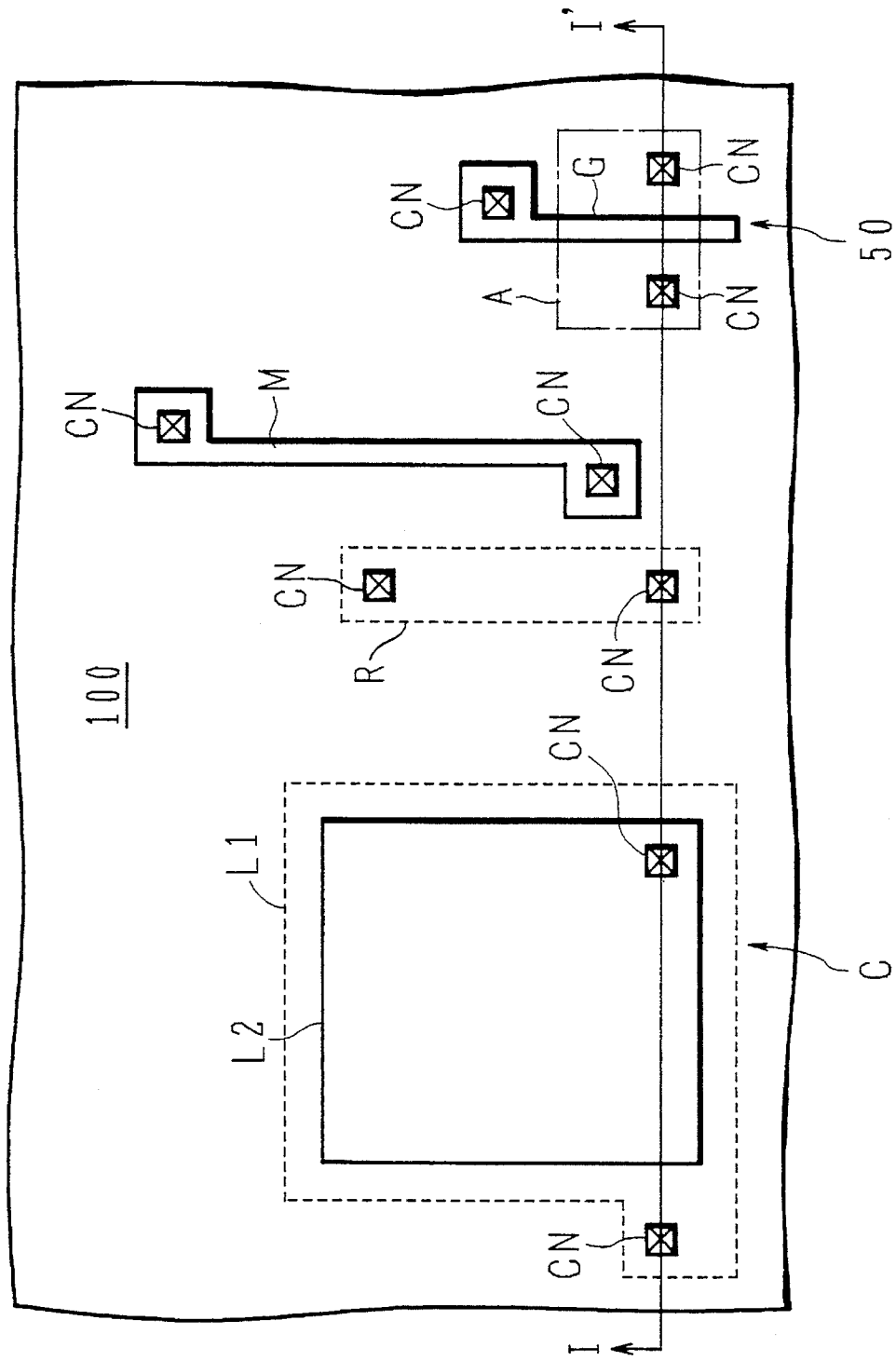
FIG. 2 is a plan view showing the structure of a semiconductor device manufactured by the steps shown in FIG. 1.

FIG. 2 is a plan view illustratively showing the structure of an analog MOS integrated circuit manufactured by the steps shown in FIG. 1, wherein a capacitor C, a resistor R, a metal wiring M, and a MOSFET 50 are shown to be formed on a semiconductor substrate 100. FIGS. 3 to 12 are cross sections taken along line I—I' of FIG. 2, illustrating the sequential steps of forming circuit elements corresponding to the steps 1a to 1h shown in FIG. 1. FIG. 12 further shows another MOSFET. Each manufacturing step of this embodiment will be described in connection with FIGS. 3 to 12.

Figure 3:
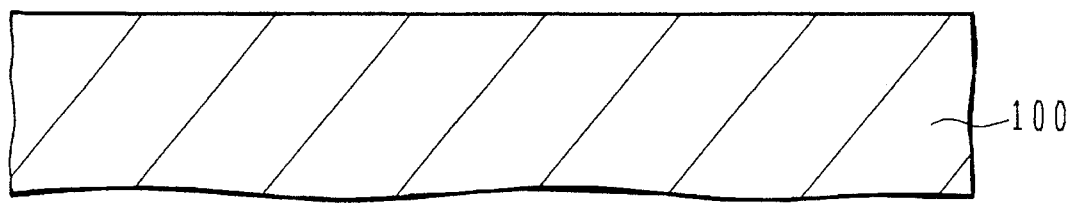
FIGS. 3 to 13 are cross sections taken along line I—I of FIG. 2, explaining the sequential steps of manufacturing a semiconductor device described with FIG. 1.
Figure 4:
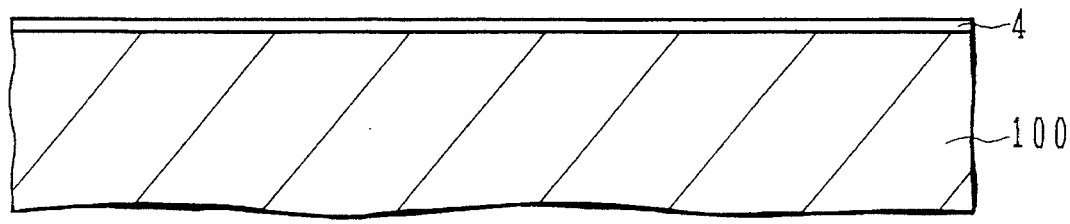
Figure 5:
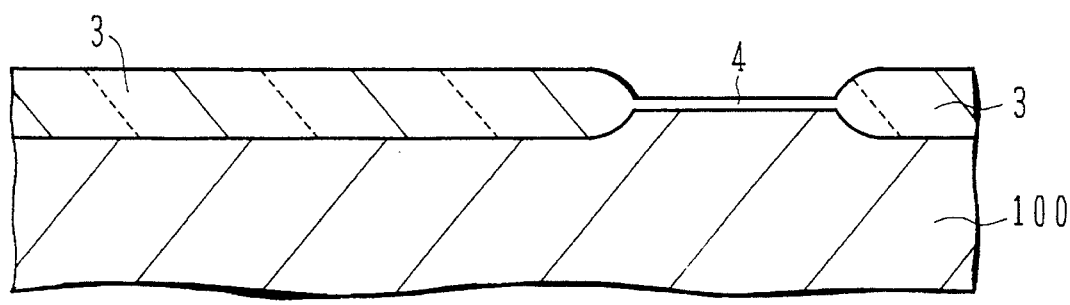

Referring to FIG. 3, a semiconductor substrate 100 made of Si, is prepared. As shown in FIG. 4, a gate oxide film 4 is formed on the surface of a semiconductor substrate 100 to a predetermined film thickness. Next, a mask film (not shown) such as a silicon nitride film for preventing a growth of an oxide film is formed on the surface of the gate oxide film 4. The nitride film is selectively removed to leave the area corresponding to the active region where a MOSFET is to be formed. A high temperature thermal oxidation process is performed to grow a thick field oxide film 3 at the area where the nitride film has been removed. At the area where the nitride film covers the semiconductor substrate, the oxide film is not grown to leave the thin gate oxide film 4. This area is defined as the active region. After the growth of the field oxide film 3, the nitride film is completely removed. FIG. 5 shows this state.

Figure 6:
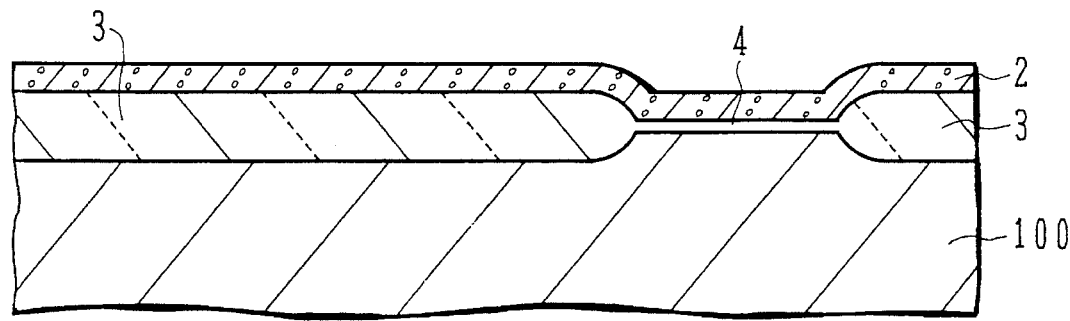

Next, referring to FIG. 1, at a polycrystalline silicon depositing step 1a, a polycrystalline silicon layer 2 is conformally deposited on the whole surface of the substrate by chemical vapor deposition as shown in FIG. 6. Manufacturing condition for polycrystalline silicon through chemical vapor deposition technique is as follows:

gas: mixture gas of $SiH_4$ and $N_2$ (20%/80%)

pressure: 30 Pa flow rate: 200 sccm substrate temperature: 600° C.

When a substrate temperature is set to be far less than the above-mentioned substrate temperature, amorphous silicon is formed instead of polycrystalline silicon. In this case, amorphous silicon is transformed into polycrystalline silicon by raising the substrate temperature up to the above-mentioned temperature.

Figure 7:
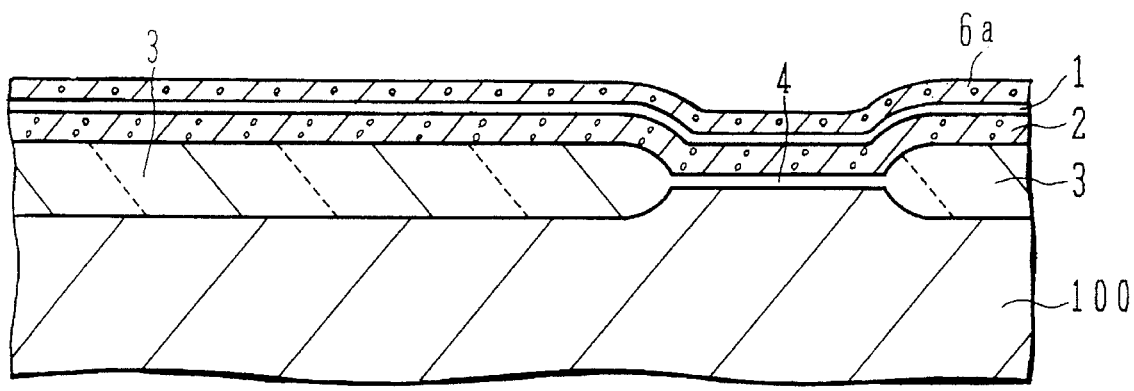

At the next impurity diffusing step 1b, impurities such as phosphor are uniformly diffused in the polycrystalline silicon layer 2 to an impurity concentration of about $10^{20}$ atoms/cm$^3$. At the next step 1c for forming a dielectric film for a capacitor insulating film, a dielectric film 1 to be used as a capacitor insulating film is formed conformally on the surface of the polycrystalline silicon layer 2 as shown in FIG. 7. This dielectric film 1 may be a single layer silicon oxide film, a laminated film such as a stack of a silicon nitride film and a silicon oxide film, or a laminated film such as a stack made of a tantalum oxide film and a silicon oxide film.

The dielectric film 1 may be a laminated film having three layers made of two silicon oxide films and a silicon nitride film intervening between the two silicon oxide films. A silicon oxynitride film can be used in place of the silicon nitride film.

For example, the silicon oxide film can be made by the method of plasma chemical vapor deposition (CVD) using the mixed gas including tetraethoxysilane (TEOS) and ozone gas, or CVD using ECR (electron cyclotron resonance) plasma. The silicon oxide film may be a phospho-silicate glass (PSG) film or a boro-phospho-silicate glass (BPSG) film made by plasma CVD. The silicon oxide film may be formed by thermal oxidation of a polycrystalline silicon film or by the method of spin-on-glass (SOG). The material and thickness of the dielectric film are selected so as to give a necessary capacitance C between capacitor electrodes.

At the step 1d of polycrystalline silicon forming in FIG. 1, a second polycrystalline silicon layer 6a is deposited on the dielectric film 1 by CVD. Manufacturing condition for polycrystalline silicon through chemical vapor deposition technique is as follows:

gas: mixture gas of $SiH_4$ and $N_2$ (20%/80%)

pressure: 30 Pa flow rate: 200 sccm substrate temperature: 600° C.

When a substrate temperature is set to be far less than the above-mentioned substrate temperature, amorphous silicon is formed instead of polycrystalline silicon. In this case, amorphous silicon is transformed into polycrystalline silicon by raising the substrate temperature up to the above-mentioned temperature.

Then, impurities such as phosphor are doped into the polycrystalline silicon layer 6a to a concentration of about $10^{20}$ atoms/cm$^3$, similar to the case of the lower polycrystalline silicon layer 2.

If thermal treatment is performed before the second polycrystalline silicon depositing step 1d shown in FIG. 1, the reliability of a finished capacitor C will be improved. Namely, not only the electrical and physical properties of the dielectric film can be improved because of the densification of the dielectric film, but also the polycrystalline silicon layer 6a can be prevented from being peeled off due to degassing or stress change of the dielectric film layer when thermal treatment is performed before the polycrystalline silicon layer 6a depositing step. Particularly, the contact between the polycrystalline silicon layer 6a and dielectric film 1 becomes more tight. It is also possible to prevent the impurities in the polycrystalline silicon layer 2 frown being diffused again.

Figure 8:
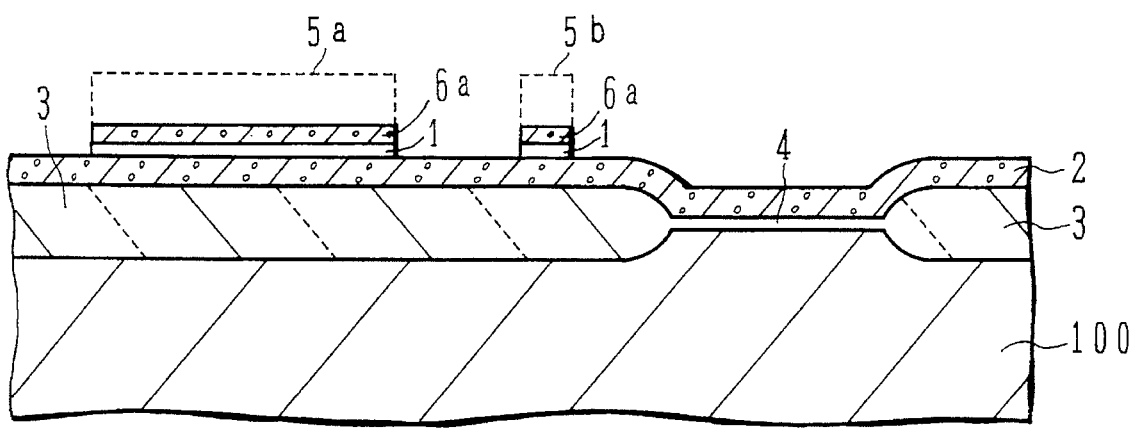

Next, at a patterning step 1e shown in FIG. 1, photoresist such as a novolac photoresist is coated on the surface of the polycrystalline silicon layer 6a. The photoresist is thereafter selectively exposed and removed through a development process while leaving unremoved the areas where a capacitor C and a resistor R are to be formed. Using the left photoresist as an etching mask, the polycrystalline silicon layer 6a and the dielectric film 1 are removed, as shown in FIG. 8. The layer 6a and the film 1 is therefore selectively removed while leaving unetched the areas where the capacitor C and resistor R are to be formed.

The polycrystalline silicon layer 6a is removed by microwave (frequency 2.45 GHz) plasma etching or ECR plasma etching at a pressure of several mTorr, using a reactive etching gas formed of a mixed gas of Cl$_2$ and O$_2$, or CF$_4$ gas, or SF$_6$ gas.

Upon etching the dielectric film 1, the polycrystalline silicon layer 2 at which a MOSFET gate electrode is formed later is subjected to a surface treatment. It is therefore preferable to use an etching method which can keep the substrate clean and can provide a high etching selectivity (of the capacitor insulating film to the polycrystalline silicon film). For example, if the dielectric film 1 is a laminated film having a silicon oxide lower layer, the upper layer is removed by dry etching, and the lower layer is removed by buffered hydrofluoric acid (HF+NH$_4$F+(H$_2$O)) or the like for stable etching. The upper layer may be removed by RF plasma etching using a mixed gas of CF$_4$ and CHF$_3$ as an etching gas at a pressure of 160 mTorr. The RF power is about 700 W and the RF frequency is 13.56 MHz.

After etching the polycrystalline silicon layer 6a and the dielectric film 1 as shown in FIG. 8, photoresist 5a and 5b on the capacitor C and resistor R areas is removed. The remaining dielectric films define positions of the lower electrode of the capacitor and the resistor.

Figure 9:
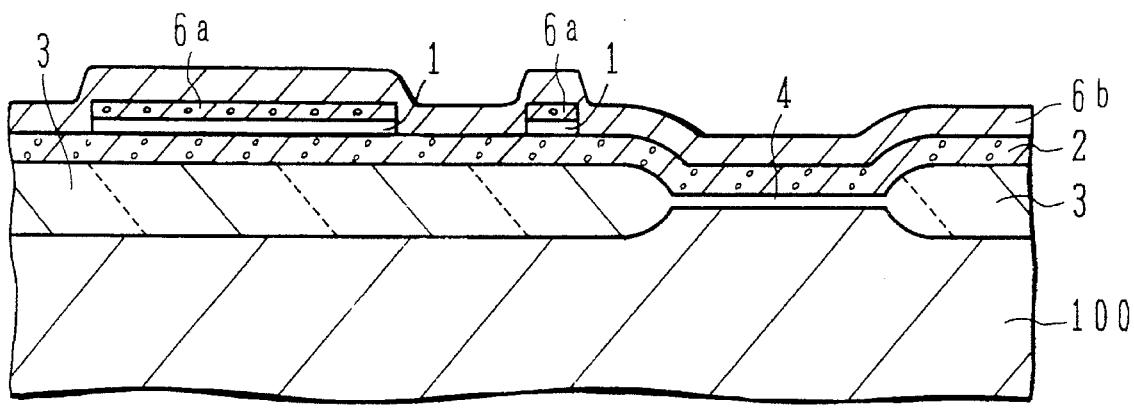

Next, at a refractory metal silicide layer depositing step if shown in FIG. 1, a refractory metal silicide layer 6b such as WSi$_x$ is deposited as shown in FIG. 9, covering conformally the polycrystalline silicon layer 2, the polycrystalline silicon layer 6a and the dielectric film 1.

A tungsten silicide (WSi$_x$) film may be formed by sputtering or CVD. In the case of forming a WSi$_x$ film by sputtering, for example magnetron sputtering apparatus is used, wherein WSi$_x$ is used as a target and Ar is used as a sputtering gas. A WSi$_x$ film is deposited at a pressure of several mTorr. In the case forming a WSi$_x$ film by CVD, for example, tungsten hexaflucride (WF$_6$) and silane (SiH$_4$) are used as the source gases to deposit a WSi$_2$ film by utilizing the reaction $$WF_6 + 2SiH_4 \rightarrow WSi_2 + 6HF + H_2.$$

The refractory metal silicide layer 6b may be formed of MoSi$_x$, TiSi$_x$, TaSi$_x$, or the like. Also, the refractory metal silicide layer 6b may be formed of metal in place of refractory metal silicide. The term "metal" will be used to mean metal or metal silicide in this specification, unless otherwise specified.

After the deposition of the refractory metal silicide layer and before application of an interlayer insulating layer, the device is heated e.g. to about 1100° C. to lower the resistance value of the refractory metal silicide capacitor electrode and the polycide gate electrode.

Figure 10:
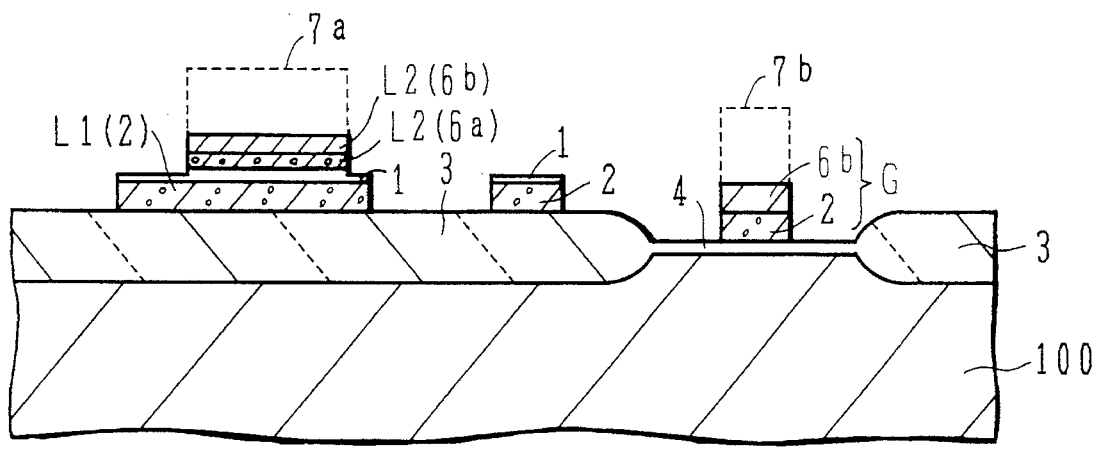

Next, a patterning step 1g for a gate electrode and the like shown in FIG. 1 is performed as illustrated in FIG. 10. First, photoresist is coated on the surface of the refractory material layer 6b. The photoresist is selectively exposed and removed through a development process while leaving unremoved the areas where the upper electrode L2 of the capacitor C and the gate electrode G of MOSFET 50 are to be formed.

Next, at a polycide etching step 1h shown in FIG. 1, a commonly used polycide etching process is performed by using the remaining photoresist as the etching mask. The polycide electrode is etched by using an ECR (electron cyclotron resonace) plasma etcher available from Sumitomo Metal Industries, Ltd., Japan. The other conditions include an etching gas of Cl$_2$+O$_2$ at flow rate of 25 and 11 sccm, respectively, a pressure of 2 mTorr, an RF power of 40 W at 13.56 MHz, microwave power of 1400 W at 2.45 GHz, and an electrode temperature of 15° to 20° C.

As a result, the refractory metal silicide layer 6b and the polycrystalline silicon layer 6a are selectively removed leaving only part of the refractory metal silicide layer 6b and the polycrystalline silicon layer 6a at the areas corresponding to the upper electrode L2 of the capacitor C and the gate electrode G of MOSFET 50 simultaneously. Also removed is the polycrystalline silicon layer 2 at the area not covered with the dielectric film 1. Because this dielectric film 1 serves as an etching stopper, the resistor R and the lower electrode L1 of the capacitor C can be automatically and simultaneously patterned where the dielectric films 1 remain.

The dielectric film 1 serves as an etching stopper, but is slightly etched by the etching gas. In this case, the dielectric film 1 at the area of capacitor where no upper electrode L2 is formed and at the resister R is slightly etched. The dielectric film 1 in the area of capacitor will have approximately equal thickness and will have substantially coplanar surface with the dielectric film on the resistor R.

After the polycide and polysilicon etching process, photoresist 7a and 7b on the refractory metal silicide layer is removed. As shown in FIG. 10, a silicide layer 6b is formed on the polycrystalline silicon layer 2 at the gate electrode G, forming a polycide electrode.

Next, processes similar to those commonly used for a general MOS integrated circuit are sequentially performed, including an ion implantation and thermal diffusion process for forming source and drain 10N, 10P , . . . , a process of forming an interlayer insulating film 20, a process of forming electrode contact holes CN, a depositing and patterning process for a metal wiring M, and other processes as is shown in FIG. 12.

Figure 11:
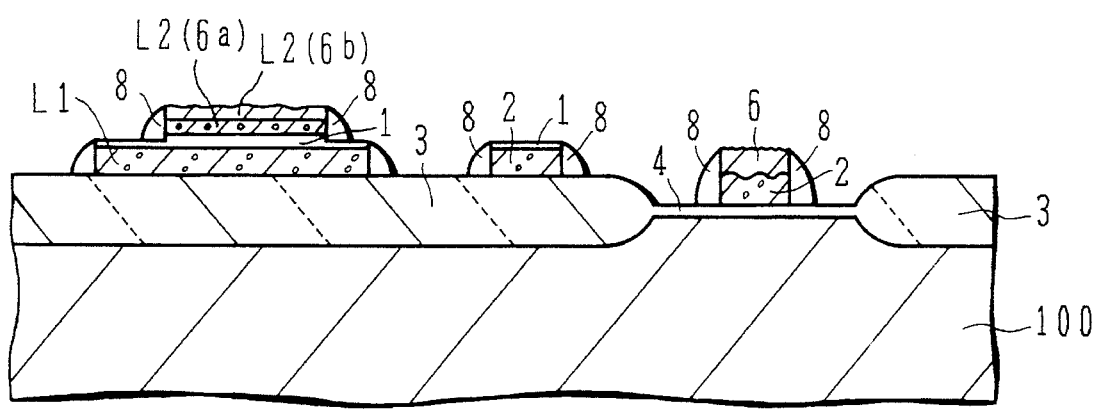
Figure 12:
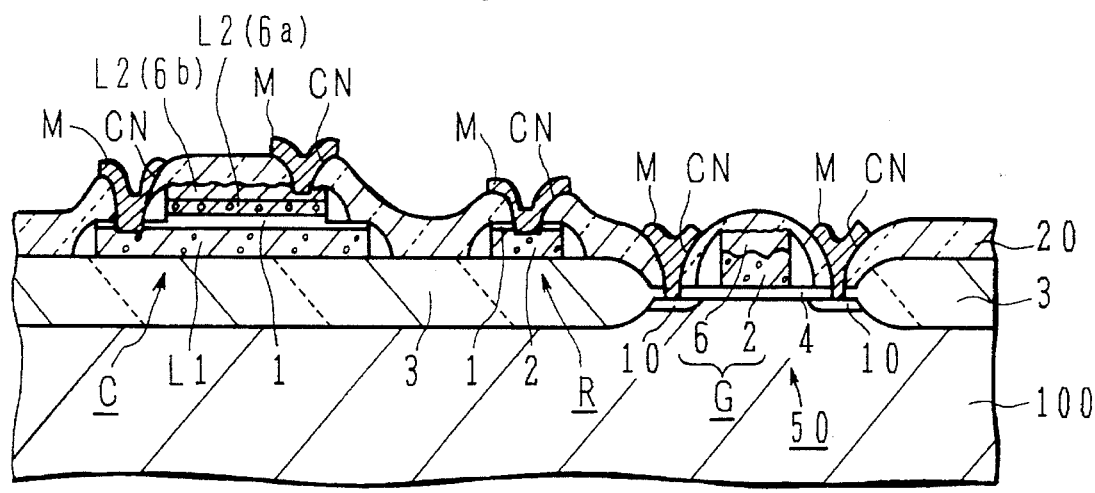

If a MOSFET of an LDD (lightly doped drain) structure is to be formed, side wall spacers 8, 8, . . . are formed as shown In FIG. 11 after the polycide etching process by using an insulating film CVD and a reactive ion etching. A finished analog MOS integrated circuit has the sectional structure such as shown in FIG. 12. Based on a manufacturing method according to the present embodiment, the finished integrated circuit has (1) a gate electrode having a polycrystalline silicon layer of a thickness substantially identical to a collective thickness of the lower electrode of the capacitor element and the second polycrystalline layer; and (2) the lower electrode of the capacitor element being coplanar with a conductive element of the resistor element.

Figure 13:
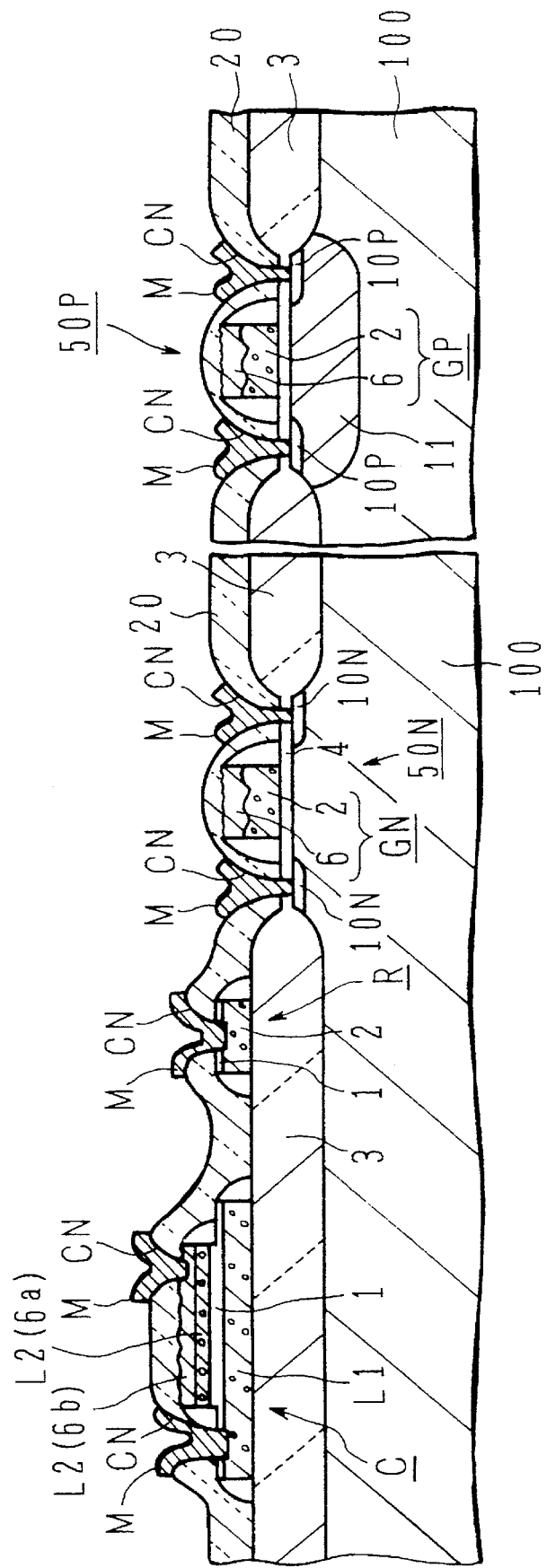

Although FIGS. 3 to 12 show one MOSFET as a typical example, FIG. 13 shows a CMOS structure including an n-channel MOSFET 50N and a p-channel MOSFET 50P. When a CMOS structure is to be formed, a well or wells are formed in the active regions before forming a field oxide film 3 as shown in FIG. 5. For example, when the silicon substrate 100 is p-type, an n-type well or wells are formed where p-channel MOSFET 50P is to be formed. Gate electrodes GN and GP of the n-channel MOSFET 50N and the p-channel MOSFET 50P are formed through the same processes upto the polycide etching step 1h of FIG. 1.

In the step of diffusing impurities for forming source/drain regions, n-type impurities such as phosphor are doped to the source/drain regions 10N of the n-channel MOSFET 50N, and p-type impurities such as boron are doped to the source/drain regions 10P of the p-channel MOSFET 50P. For obtaining a desired threshold voltage, impurities may be doped to the channel regions to a selected concentration after defining active regions as shown in FIG. 5, and/or the work function of the gate electrode may be changed by doping appropriate impurities to the gate electrodes of the n-channel MOSFET 10N or p-channel MOSFET 10P after forming the polycrystalline silicon layer 2 as shown in FIG. 6.

As described above, because the capacitor C, resistor R, and gate electrodes GN, GP are formed by the same process, the dynamic characteristics and optimum design of CMOS transistors can be reliably obtained. A capacitor C and resistor R of high precision can be formed easily at low cost and with a small number of steps.

Figure 14:
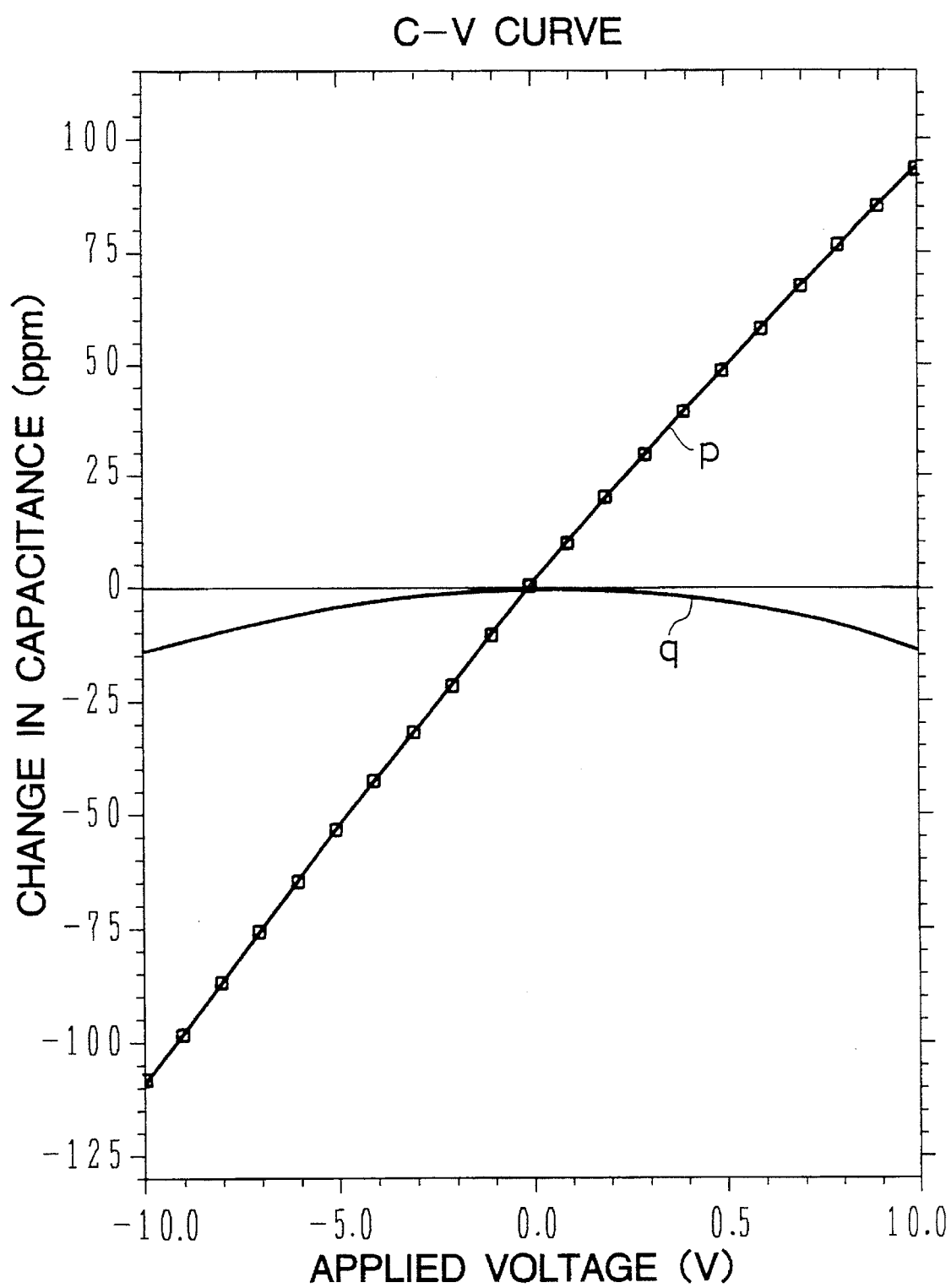
FIG. 14 is a graph of the change in capacitance versus applied voltage between capacitor electrodes.
Figure 15:
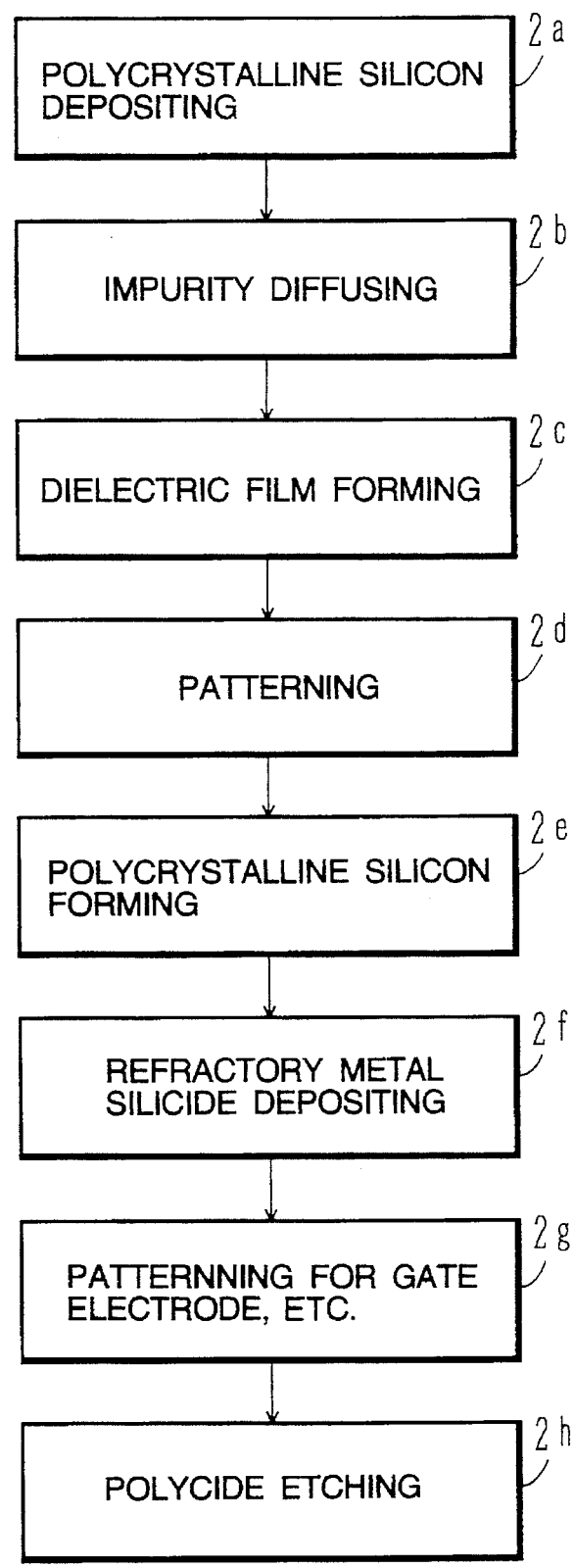
FIG. 15 is a flow chart explaining the steps of manufacturing a semiconductor device according to another embodiment of the present invention.

FIG. 14 shows change in capacitance versus applied voltage between capacitor electrodes for a capacitor of $Si/SiO_2/Si$ structure and a capacitor of $Si/SiO_2$/metal structure. The abscissa represents a bias voltage in the unit of volt, and the ordinate represents the change in capacitance compared to the static capacitance when the DC bias voltage is 0 V, in the unit of ppm. The Si electrodes of the two capacitors are both doped with n-type impurities of a concentration $2 \times 10^{20}$ cm$^3$. In the case of the capacitor of $Si/SiO_2$/metal structure, the positive polarity of the bias represents the case where a positive voltage is applied to the metal electrode.

In the figure, curves p and q represent the results of calculation for the change in capacitance at an operation frequency of 1 MHz for the $Si/SiO_2$/metal capacitor and the $Si/SiO_2/Si$ capacitor, respectively. The calculated behavior is almost the same when the operation frequency is changed down to 10 kHz.

In the case of $Si/SiO_2$/metal capacitor, when a positive voltage is applied to the metal electrode, an accumulation layer is formed at the interface between Si layer and $SiO_2$ layer. Thus, as the applied voltage increases, the change in capacitance gradually increases as shown by the curve p.

When a negative voltage is applied to the metal electrode, a depletion layer is formed at the interface of the Si layer. Thus, as the applied voltage is decreased, the change in capacitance also decreases.

In the case of $Si/SiO_2/Si$ capacitor, when a bias voltage is applied, an accumulation layer is formed in one Si electrode and a depletion layer is formed in the other Si electrode. Therefore, the change in capacitance versus applied voltage characteristic becomes more uniform with respect to voltage polarities as shown by the curve q compared to the $Si/SiO_2$/metal capacitor.

As is clearly seen from the figure, the voltage dependency of the static capacitance can be remarkably decreased by forming the two electrode of the capacitor C, at least in the region adjacent to the capacitor dielectric layer, both of polycrystalline silicon. Here, as can be seen from the above consideration, the thickness of the polycrystalline layer adjacent to the interface with the dielectric layer is preferably thicker than the thickness of the depletion layer to be formed.

Further, because the capacitor C, resistor R, and gate electrodes GN and GP are formed by the same process, the high temperature thermal process is required only for forming the dielectric film serving also as an etching stopper at the dielectric film forming step 1c, so that the CMOS characteristics are less deteriorated. The thermal treatment for the dielectric film is performed before the ion implantation process for the LDD structure and before the ion implantation process at a high impurity concentration for source and drain. Therefore, even if a relatively high temperature thermal treatment is performed so as to improve the quality of the dielectric film, deterioration of the CMOS characteristics is relatively low.

If a process of etching back a CVD film (side wall forming process) is used for the LDD structure, the surface of the polycrystalline silicon layer serving as a resistor is slightly etched, resulting in a variation of resistance value. However, in the above-described embodiment, by properly setting the dielectric film 1, it can be used as the etching preventing mask and a resistor of high precision can be formed easily.

Since the dielectric film 1 used as the mask is sufficiently thin so that it is not required to be removed but may be left as part of an interlayer insulating film without any trouble during manufacturing steps.

Further, because the gate electrodes GN and GP have a polycide structure, there is less possibility of degrading the CMOS characteristics to be caused by impurity ions passed through a single polycrystalline silicon layer, and it is not necessary to change the manufacturing conditions.

Still further, the gate material wiring has also a polycide structure, retaining a low resistance condition and ensuring the high speed operation.

The gate electrode of the MOSFET is formed by the use of polycide (a composite layer of a polycrystalline silicon layer and a refractory metal silicide layer). The polycrystalline silicon layer constituting a lower layer of a polycide gate structure is deposited at the same time as the lower electrode of a capacitor is deposited. The refractory metal silicide layer constituting an upper layer of a polycide gate structure is deposited at the same time as part of an upper electrode of a capacitor is deposited. Therefore, a capacitor can be formed by adding only one step for forming a polycrystalline layer constituting a lower sub-layer of an upper electrode of a capacitor.

Also, the step of depositing a polycrystalline silicon layer as a lower electrode of a capacitor is concurrently used for depositing a polycrystalline silicon layer for resistors. Thus, it becomes possible to avoid addition of a step for forming a resistors. Yet further, by depositing a dielectric film used in capacitors also on resistors for protecting the resistors, it becomes possible to avoid addition of a separate step for forming a protective film for the resistors.

Another embodiment of this invention will be described, referring to FIGS. 15 to 18. Manufacturing processes from a polycrystalline silicon depositing step 2a to a dielectric film forming step 2c are the same as the polycrystalline silicon depositing step 1a to the dielectric film forming step 1c shown in FIG. 1.

Figure 16:
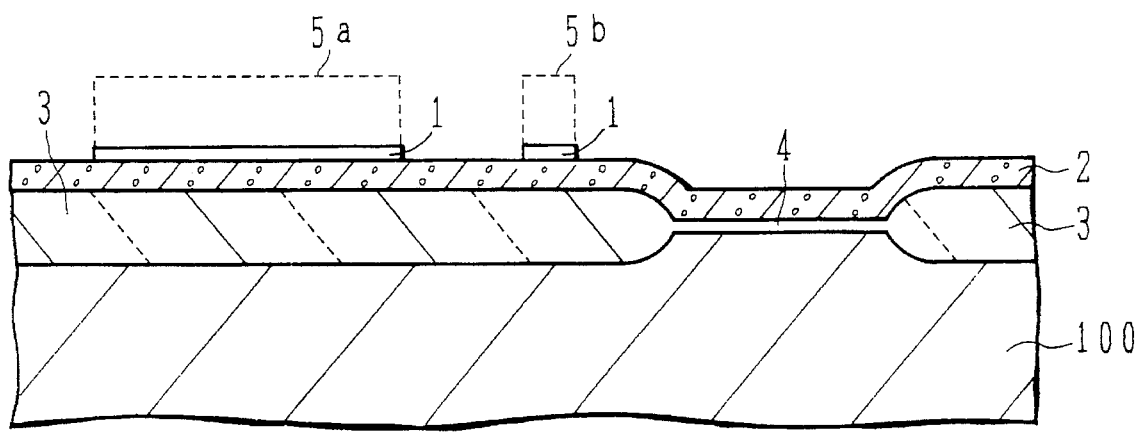
FIGS. 16 to 18 are cross sections of a semiconductor substrate explaining the sequential steps according to another embodiment of the present invention.

As shown in FIG. 16, after depositing the dielectric layer 1, the dielectric layer 1 is selectively removed except the regions of the capacitor C and the resistor R, by utilizing photolithography at the patterning step 2d.

Figure 17:
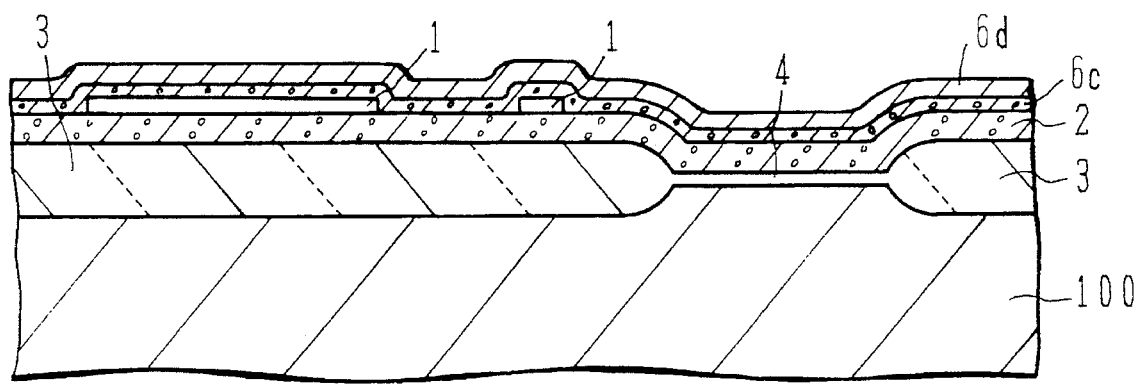

As shown in FIG. 17, a polycrystalline silicon layer 6c is deposited to cover the polycrystalline silicon layer 2 and the dielectric layer 1 at the polycrystalline silicon forming step 2e. The polycrystalline silicon layer 6e is deposited similar to the polycrystalline silicon layer 6a of FIG. 7. Next, a refractory metal silicide layer 6d is deposited on the polycrystalline silicon layer 6c at the refractory metal silicide depositing step 2f, similar to the refractory metal silicide layer 6b of FIG. 9.

Then, the capacitor C, the resistor R and the gate electrode G are patterned by a similar method as described referring to FIGS. 10 and 11 at the patterning step 2g for a gate electrode and the like and the step 2h of polycide etching. Then, an n-channel MOSFET 50N and a p-channel MOSFET 50P are formed by the process similar to one described referring to FIGS. 12 and 13, contact holes are formed through the insulating films, and wirings are made by deposition and patterning.

Figure 18:
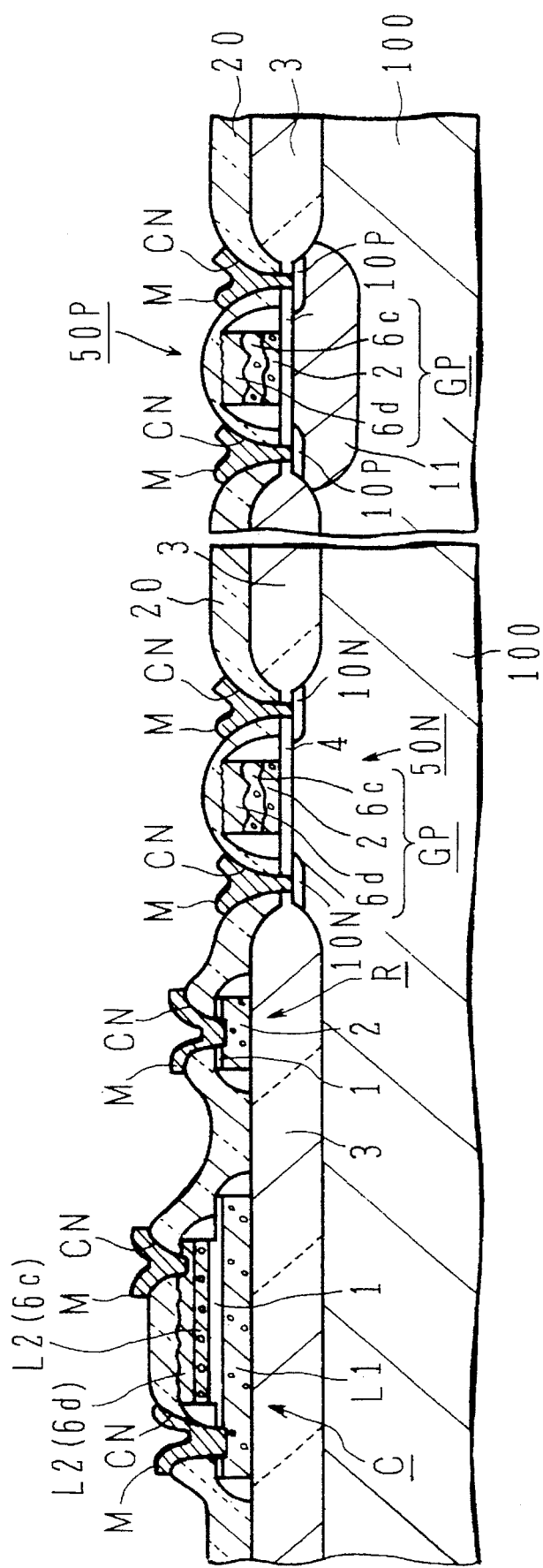

FIG. 18 shows a cross section of a semiconductor substrate including a capacitor C, a resistor R, an n-channel MOSFET 50N, a p-channel MOSFET 50P, manufactured according to another embodiment. A three-layer structure is employed for the gate electrodes GN and GP of the n-channel MOSFET 50N and the p-channel MOSFET 50P. The three-layer structure is formed of a pair of polycrystalline silicon layers 2 and 6c and a refractory metal silicide layer 6d. Except the difference in the gate electrode GN and GP, structures of capacitor C and the resistor R are the same with the semiconductor device shown in FIGS. 12 and 13.

Although the gate electrodes GN and GP have a three-layer structure, the lower two layers are both formed of polycrystalline silicon. When these two layers have the same conductivity type, the gate electrodes GN and GP effectively have the same structure as those shown in FIG. 13. Therefore, the embodiments shown in FIGS. 15 to 18 will have similar effects as the embodiments shown in FIGS. 3 to 12.

Although description has been made on the case of using polycrystalline silicon for the gate electrode of MOSFET and the electrode of capacitor, amorphous silicon may be used in place of polycrystalline silicon.

The present invention has been described in connection with the above embodiments. The invention is not intended to be limited only to the embodiments, but it is apparent for those skilled in the art that various substitutions, changes, improvements, combinations, and the like are possible.

We claim:

1. A method of manufacturing a semiconductor device having at least a MOSFET, a capacitor element, and a resistor formed on the surface of a semiconductor substrate, comprising the steps of:

(a) forming a gate oxide film on the surface of said semiconductor substrate;

(b) forming a first conductive layer of a first material on said gate oxide film;

(c) forming a dielectric film used for capacitor insulating film on said first conductive layer;

(d) forming a second conductive layer of the first material on said dielectric film;

(e) removing said dielectric film and said second conductive layer while leaving unremoved areas corresponding to a lower electrode of said capacitor element and said resistor element respectively;

(f) forming a refractory material layer covering said first conductive layer, said dielectric film and said second conductive layer;

(g) forming a masking member covering said refractory material layer at an area corresponding to an upper electrode of said capacitor element and an area corresponding to a gate electrode of said MOSFET; and (h) removing said refractory material layer and said second conductive layer at an area other than said areas corresponding to the upper electrode and the gate electrode and removing said first conductive layer not covered with said dielectric film, by using said mask member as an etching mask and said dielectric film as an etching stopper, wherein said capacitor element has a structure such that said dielectric film is sandwiched between said first conductive layer and said second conductive layer, and said resistor element is made of said first conductive layer.

2. A method according to claim 1, further comprising the step of:

(i) after step (a) forming an interlayer insulating layer over the semiconductor substrate.

3. A method according to claim 2, further comprising the step of:

(j) heating the semiconductor substrate after the step (c) and prior to the step (d).

4. A method according to claim 2, wherein the first material comprises a material selected from a group consisting of polycrystalline silicon and amorphous silicon.

5. A method according to claim 2, wherein dielectric film is selected from the group consisting of a silicon oxide film, a laminated layer of a silicon nitride film and a silicon oxide film, and a laminated layer of a tantalum oxide film and a silicon oxide film.

6. A method according to claim 2, wherein the refractory metal silicide film is formed of a material selected from the group consisting of $WSi_x$, $MoSi_x$, $TiSi_x$ and $TaSi_x$.

7. A method according to claim 2, wherein the step (g) comprises the steps of:

(g-1) forming a photoresist layer on the surface of the refractory metal layer; and (g-2) selectively removing the photoresist layer to form resist patterns on areas corresponding to the upper electrode of said capacitor element and the gate electrode of said MOSFET.

8. A method of manufacturing a semiconductor device having at least a MOSFET, a capacitor element and a resistor formed on the surface of a semiconductor substrate, comprising the steps of:

(a) forming a gate oxide film on the surface of said semiconductor substrate;

(b) forming a first conductive layer of a first material on said gate oxide film;

(c) forming a dielectric film used for capacitor insulating film on said first conductive layer;

(d) removing said dielectric film while leaving unremoved areas corresponding to a lower electrode of said capacitor element and said resistor element, respectively;

(e) forming a second conductive layer of the first material on said dielectric film;

(f) forming a refractory material layer on said second conductive layer;

(g) forming a masking member covering said refractory material layer at an area corresponding to an upper electrode of said capacitor element and an area corresponding to a gate electrode of said MOSFET; and (h) removing said refractory material layer and said second conductive layer at an area other than said areas corresponding to the upper electrode and the gate electrode and removing said first conductive layer not covered with said dielectric film, by using said mask member as an etching mask and said dielectric film as an etching stopper, wherein said capacitor element has such a structure that said dielectic film is sandwiched between said first conductive layer and said second conductive layer and said resistor element is made of said first conductive layer.

9. A method according to claim 8, further comprising the step of:

(i) after step (h) forming an interlayer insulating layer over the semiconductor substrate.

10. A method according to claim 9, further comprising the step of:

(j) heating the semiconductor substrate after the step (c) and prior to the step (d).

11. A method according to claim 8, wherein dielectric film is selected from the group consisting of a silicon oxide film, a laminated layer of a silicon nitride film and a silicon oxide film, and a laminated layer of a tantalum oxide film and a silicon oxide film.

12. A method according to claim 8, wherein the first material comprises a material selected from a group consisting of polycrystalline silicon and amorphous silicon.

13. A method according to claim 8, wherein the refractory metal silicide film is formed of a material selected from the group consisting of $WSi_x$, $MoSi_x$, $TiSi_x$ and $TaSi_x$.

* * * * *